(12) United States Patent
Mukai

(10) Patent No.: US 10,389,330 B2
(45) Date of Patent: Aug. 20, 2019

(54) ELECTRONIC COMPONENT

(71) Applicant: Murata Manufacturing Co., Ltd., Nagaokakyo-shi, Kyoto-fu (JP)

(72) Inventor: Yusuke Mukai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/673,445

(22) Filed: Aug. 10, 2017

(65) Prior Publication Data

US 2017/0338789 A1 Nov. 23, 2017

Related U.S. Application Data

(63) Continuation of application No. PCT/JP2016/050497, filed on Jan. 8, 2016.

(30) Foreign Application Priority Data

Feb. 23, 2015 (JP) .................. 2015-032598

(51) Int. Cl.
*H01G 4/30* (2006.01)
*H01G 4/40* (2006.01)
(Continued)

(52) U.S. Cl.
CPC ....... *H03H 7/1758* (2013.01); *H01F 17/0013* (2013.01); *H01F 27/2804* (2013.01);
(Continued)

(58) Field of Classification Search
CPC .... H03H 7/1758; H03H 7/0115; H03H 7/463; H03H 2001/0085; H01F 17/0013;
(Continued)

(56) References Cited

U.S. PATENT DOCUMENTS

2002/0030555 A1  3/2002 Mandai et al.
2003/0043759 A1  3/2003 Yamaguchi
(Continued)

FOREIGN PATENT DOCUMENTS

JP  06-132761 A   5/1994
JP  2001-345662 A 12/2001
(Continued)

OTHER PUBLICATIONS

Official Communication issued in International Patent Application No. PCT/JP2016/050497, dated Mar. 22, 2016.

*Primary Examiner* — Robert J Pascal
*Assistant Examiner* — Kimberly E Glenn
(74) *Attorney, Agent, or Firm* — Keating & Bennett, LLP

(57) ABSTRACT

An electronic component a multilayer body including insulation layers stacked in a stacking direction, a mounting surface that opposes a circuit board when the electronic component is mounted on the circuit board, first and second input/output terminals provided on the mounting surface and adjacent to each other, a ground terminal, a first filter circuit, in the multilayer body, electrically connected between the first input/output terminal and the second input/output terminal, and a ground conductor layer, provided between the first filter circuit and the mounting surface in the stacking direction, that overlaps with the first input/output terminal and the second input/output terminal when viewed in plan view from the stacking direction, and that is connected to the ground terminal.

17 Claims, 8 Drawing Sheets

(51) Int. Cl.
  *H03H 1/00* (2006.01)
  *H03H 7/01* (2006.01)
  *H03H 7/46* (2006.01)
  *H01F 17/00* (2006.01)
  *H01F 27/28* (2006.01)

(52) U.S. Cl.
  CPC ............ *H01G 4/30* (2013.01); *H01G 4/40* (2013.01); *H03H 7/0115* (2013.01); *H03H 7/1766* (2013.01); *H03H 7/463* (2013.01); *H01F 2017/0026* (2013.01); *H01F 2027/2809* (2013.01); *H03H 2001/0085* (2013.01)

(58) Field of Classification Search
  CPC ......... H01F 27/2804; H01F 2017/0026; H01F 2027/2809; H01G 4/30; H01G 4/40
  USPC ........................................... 333/185
  See application file for complete search history.

(56) References Cited

U.S. PATENT DOCUMENTS

2003/0058063 A1* 3/2003 Sheen .................. H03H 7/46
                                                   333/132
2007/0103256 A1* 5/2007 Ishiwata ............... H01P 1/2039
                                                   333/185
2013/0121639 A1   5/2013 Shimizu

FOREIGN PATENT DOCUMENTS

| JP | 2003-158437 A | 5/2003 |
| WO | 2012/011370 A1 | 1/2012 |
| WO | 2013/121815 A1 | 8/2013 |

\* cited by examiner

ELECTRONIC COMPONENT

CROSS REFERENCE TO RELATED APPLICATIONS

This application claims the benefit of priority to Japanese Patent Application No. 2015-032598 filed on Feb. 23, 2015 and is a Continuation Application of PCT Application No. PCT/JP2016/050497 filed on Jan. 8, 2016. The entire contents of each application are hereby incorporated herein by reference.

BACKGROUND OF THE INVENTION

1. Field of the Invention

The present invention relates to electronic components, and particularly relates to an electronic component including a filter circuit.

2. Description of the Related Art

The electronic component disclosed in International Publication No. WO 2012/011370 is known as an example of an electronic component. This electronic component includes a multilayer body, and first to third land electrodes. The first to third land electrodes are rectangular in shape, and are provided on a bottom surface of the multilayer body.

With the electronic component disclosed in International Publication No. WO 2012/011370, there is demand for a smaller size. However, if the electronic component is made smaller, gaps between adjacent ones of the first to third land electrodes also becomes smaller. There is thus a risk that, for example, a high-frequency signal input from the first land electrode is outputted from the second land electrode or the third land electrode without passing through circuitry within the multilayer body. In other words, there is a problem in that there is less isolation between the first to third land electrodes.

SUMMARY OF THE INVENTION

Accordingly, preferred embodiments of the present invention provide electronic components capable of improving isolation between input/output terminals.

An electronic component according to an aspect of a preferred embodiment of the present invention includes a multilayer body including a plurality of insulation layers stacked in a stacking direction, including a mounting surface that opposes a circuit board when the electronic component is mounted on the circuit board; a first input/output terminal and a second input/output terminal that are provided on the mounting surface and are adjacent to each other; a ground terminal; a first filter circuit, provided in the multilayer body, electrically connected between the first input/output terminal and the second input/output terminal; and a ground conductor layer, provided between the first filter circuit and the mounting surface in the stacking direction, that overlaps with the first input/output terminal and the second input/output terminal when viewed in plan view from the stacking direction, and that is connected to the ground terminal.

According to various preferred embodiments of the present invention, isolation between input/output terminals is improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is an equivalent circuit diagram of an electronic component 10a.
FIG. 9 is an exploded perspective view of the electronic component 10a.
FIG. 10 is a graph illustrating bandpass characteristics of the electronic component 10a.

DETAILED DESCRIPTION OF THE PREFERRED EMBODIMENTS

Electronic components according to preferred embodiments of the present invention will be described hereinafter with reference to the drawings.

Figure 1:
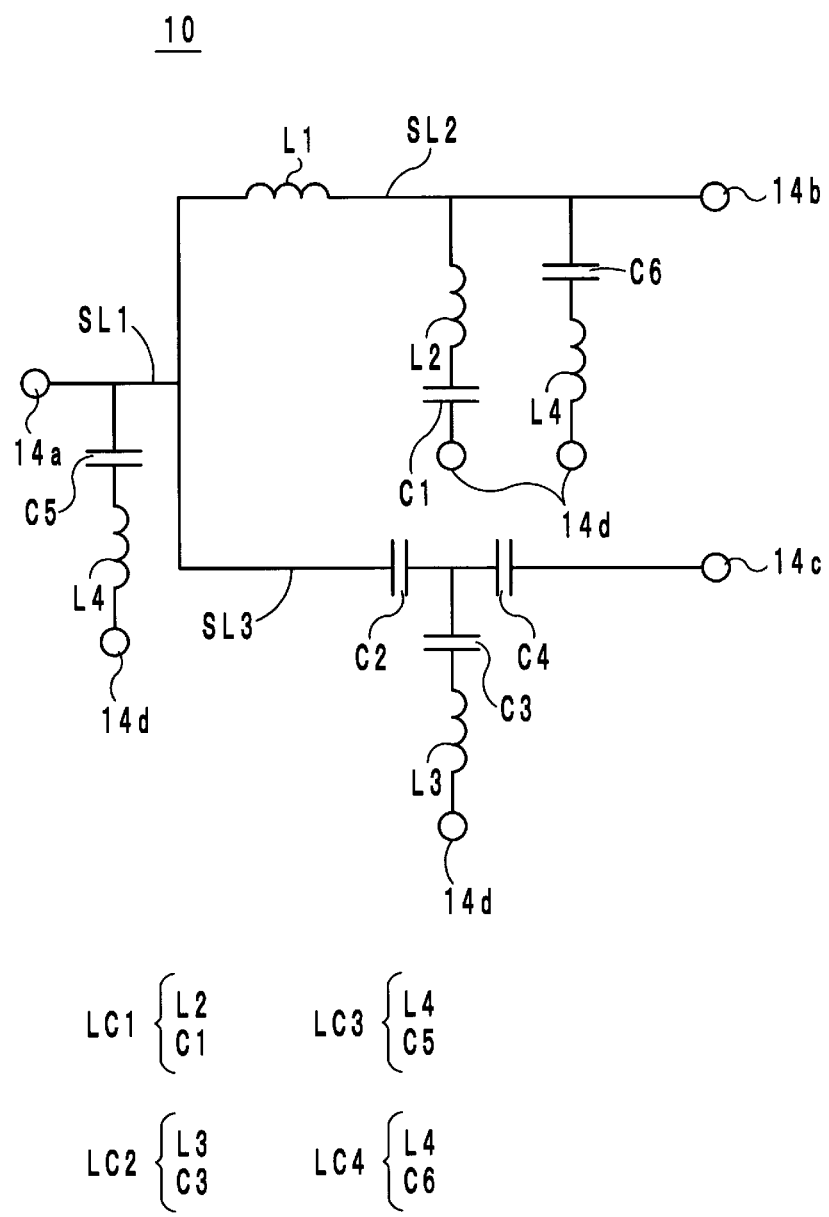
FIG. 1 is an equivalent circuit diagram of an electronic component 10 according to a preferred embodiment of the present invention.

First, a circuit configuration of an electronic component 10 according to a preferred embodiment will be described with reference to the drawings. FIG. 1 is an equivalent circuit diagram of the electronic component 10 according to the present preferred embodiment.

The electronic component 10 preferably is a diplexer, and as illustrated in FIG. 1, includes signal paths SL1 to SL3, outer electrodes 14a to 14d, inductors L1 to L4, and capacitors C1 to C6.

The outer electrodes 14a to 14c are input/output terminals for high-frequency signals. The outer electrode 14d is a ground terminal connected to a ground potential. One end of the signal path SL1 is connected to the outer electrode 14a. The other end of the signal path SL1 is connected to one end of the signal paths SL2 and SL3. The other end of the signal path SL2 is connected to the outer electrode 14b. The other end of the signal path SL3 is connected to the outer electrode 14c. In other words, the electronic component 10 has a structure in which the two signal paths SL2 and SL3 branch out from the signal path SL1.

The inductor L1 is provided in the signal path SL2. The inductor L2 and the capacitor C1 are connected in series to define an LC serial resonator LC1. One end of the LC serial resonator LC1 is connected to the signal path SL2 between the inductor L1 and the outer electrode 14b. The other end of the LC serial resonator LC1 is connected to the outer electrode 14d.

The capacitor C6 (an example of a second capacitor) and the inductor L4 (an example of a first inductor) are connected in series to define an LC serial resonator LC4 (an example of a second LC serial resonator). One end of the LC serial resonator LC4 is connected to the signal path SL2 between the inductor L1 and the outer electrode 14b. The other end of the LC serial resonator LC4 is connected to the outer electrode 14d.

The inductor L1 and LC serial resonators LC1 and LC4 configured in this manner define a low pass filter (an example of a first filter circuit) electrically connected between the outer electrode 14a (an example of a first input/output terminal) and the outer electrode 14b (an example of a second input/output terminal).

The capacitors C2 and C4 are connected in series in the signal path SL3. The capacitor C3 and the inductor L3 are connected in series to define an LC serial resonator LC2. One end of the LC serial resonator LC2 is connected to the signal path SL3 between the capacitor C2 and the capacitor C4. The other end of the LC serial resonator LC2 is connected to the outer electrode 14d.

The capacitors C2 and C4 and LC serial resonator LC2 configured as described above define a high pass filter connected between the outer electrode 14a and the outer electrode 14c (a third input/output terminal).

The capacitor C5 (an example of a first capacitor) and the inductor L4 (an example of a first inductor) are connected in series to define an LC serial resonator LC3 (an example of a first LC serial resonator). One end of the LC serial resonator LC3 is connected to the signal path SL1. The other end of the LC serial resonator LC3 is connected to the outer electrode 14d.

As mentioned earlier, the electronic component 10 configured as described above preferably defines and functions as a diplexer. Of a high-frequency signal inputted from the outer electrode 14a, a high-frequency signal in a relatively low frequency band (near 2 GHz, for example) is outputted from the outer electrode 14b. Of the high-frequency signal inputted from the outer electrode 14a, a high-frequency signal in a relatively high frequency band (5 GHz to 6 GHz, for example) is outputted from the outer electrode 14c.

Figure 2:
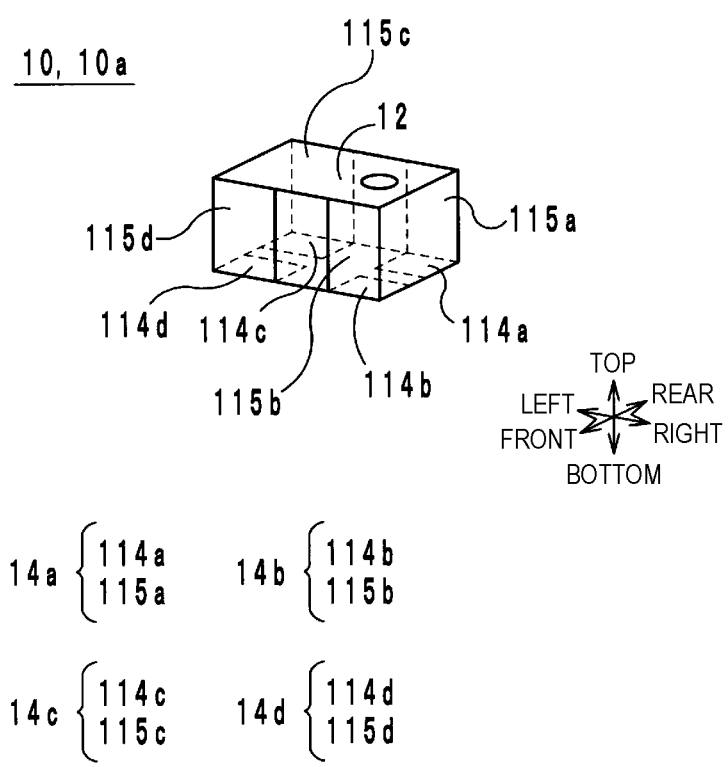
FIG. 2 is an external perspective view of the electronic component 10.
Figure 3:
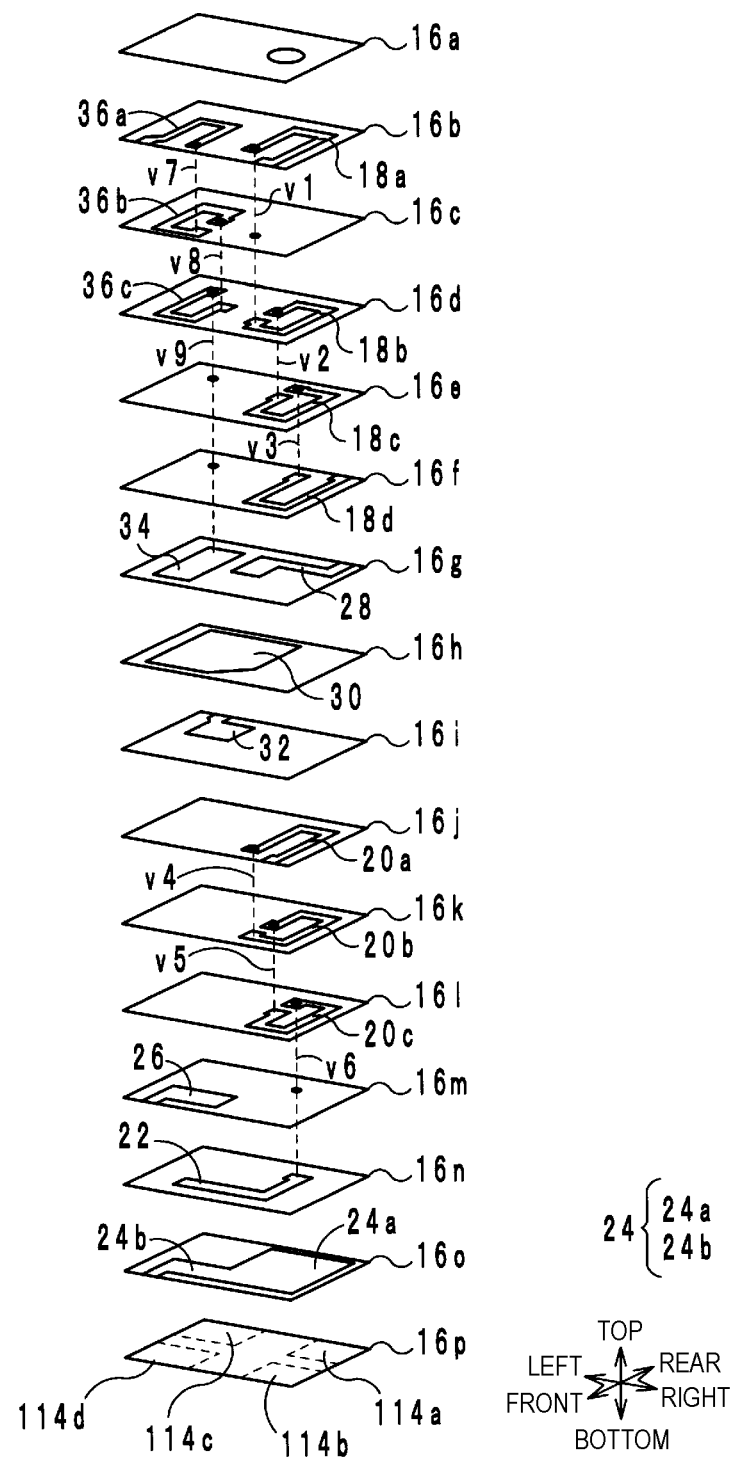
FIG. 3 is an exploded perspective view of the electronic component 10.

Next, the specific configuration of the electronic component 10 will be described with reference to the drawings. FIG. 2 is an external perspective view of the electronic component 10. FIG. 3 is an exploded perspective view of the electronic component 10. In the electronic component 10, a stacking direction of a multilayer body 12 is defined as an up-down direction. Additionally, when the electronic component 10 is viewed in plan view from above, a direction in which longer sides of an upper surface of the electronic component 10 extend is defined as a left-right direction, and a direction in which shorter sides of the upper surface of the electronic component 10 extend is defined as a front-rear direction.

As illustrated in FIG. 2 and FIG. 3, the electronic component 10 includes the multilayer body 12, the outer electrodes 14a to 14d, inductor conductor layers 18a to 18d, 20a to 20c, and 36a to 36c, capacitor conductor layers 22, 24, 26, 28, 30, 32, and 34, and via hole conductors v1 to v9.

The multilayer body 12 preferably has a rectangular or substantially rectangular parallelepiped shape, and is formed by laminating insulation layers 16a to 16p (an example of a plurality of insulation layers) in that order from top to bottom. A bottom surface of the multilayer body 12 defines and functions as a mounting surface that faces a circuit board when mounting the electronic component 10 on the circuit board.

The insulation layers 16a to 16p preferably have rectangular or substantially rectangular shapes extending in the left-right direction when viewed in plan view from above, and are preferably formed from a ceramic material or the like, for example. In the following, upper surfaces of the insulation layers 16a to 16p will be called "front surfaces", and lower surfaces of the insulation layers 16a to 16p will be called "back surfaces".

The outer electrode 14a includes a bottom surface portion 114a and a side surface portion 115a. The bottom surface portion 114a is provided on the bottom surface so as to contact a right-rear corner of the bottom surface of the multilayer body 12, and preferably is rectangular or substantially rectangular in shape. The side surface portion 115a is provided on a rear surface of the multilayer body 12 that is parallel or substantially parallel to the up-down direction (an example of a side surface) so as to extend in the up-down direction along the right side of the rear surface of the multilayer body 12, and preferably is rectangular or substantially rectangular in shape.

The outer electrode 14b includes a bottom surface portion 114b and a side surface portion 115b. The bottom surface portion 114b is provided on the bottom surface so as to contact a right-front corner of the bottom surface of the multilayer body 12, and preferably is rectangular or substantially rectangular in shape. The side surface portion 115b is provided on a front surface of the multilayer body 12 that is parallel or substantially parallel to the up-down direction (an example of a side surface) so as to extend in the up-down direction along the right side of the front surface of the multilayer body 12, and preferably is rectangular or substantially rectangular in shape. Accordingly, the bottom surface portion 114b and the bottom surface portion 114a are adjacent to each other on the mounting surface. A gap between the bottom surface portion 114a and the bottom surface portion 114b is smaller than widths of the bottom surface portions 114a and 114b in the front-rear direction.

The outer electrode 14c includes a bottom surface portion 114c and a side surface portion 115c. The bottom surface portion 114c is provided on the bottom surface so as to contact a left-rear corner of the bottom surface of the multilayer body 12, and preferably is rectangular or substantially rectangular in shape. The side surface portion 115c is provided on a rear surface of the multilayer body 12 that is parallel or substantially parallel to the up-down direction (an example of a side surface) so as to extend in the up-down direction along the left side of the rear surface of the multilayer body 12, and preferably is rectangular or substantially rectangular in shape.

The outer electrode 14d includes a bottom surface portion 114d and a side surface portion 115d. The bottom surface portion 114d is provided on the bottom surface so as to contact a left-front corner of the bottom surface of the multilayer body 12, and preferably is rectangular or substantially rectangular in shape. The side surface portion 115d is provided on a front surface of the multilayer body 12 that is parallel or substantially parallel to the up-down direction (an example of a side surface) so as to extend in the up-down direction along the left side of the front surface of the multilayer body 12, and preferably is rectangular or substantially rectangular in shape. Accordingly, the bottom surface portion 114d and the bottom surface portion 114b are adjacent to each other on the mounting surface. A gap between the bottom surface portion 114c and the bottom surface portion 114d is smaller than widths of the bottom surface portions 114c and 114d in the front-rear direction.

The outer electrodes 14a to 14d are produced by, for example, applying Ni plating on a base electrode formed from copper or the like, and then applying Au plating. Sn plating may be applied before applying the Ni plating.

The inductor conductor layers 18a to 18d are linear conductor layers provided in right-half regions of the front surfaces of the insulation layers 16b and 16d to 16f. The inductor conductor layers 18a to 18d each has a shape obtained by cutting out a portion of a rectangular or substantially rectangular ring shape. When viewed in plan view from above, the inductor conductor layers 18a to 18d overlap with each other to define a rectangular or substantially rectangular ring-shaped track. Hereinafter, an end portion of the inductor conductor layers 18a to 18d on an upstream side in the clockwise direction will be called an upstream end, and an end portion of the inductor conductor layers 18a to 18d on a downstream side in the clockwise direction will be called a downstream end. The downstream end of the inductor conductor layer 18a is extended to the vicinity of a right end on the front side of the insulation layer 16b, and is connected to the side surface portion 115b. The upstream end of the inductor conductor layer 18d is extended to the vicinity of a right end on the rear side of the insulation layer 16f, and is connected to the side surface portion 115a (an example of a portion of the first input/output terminal provided on a side surface of the multilayer body).

The via hole conductor v1 passes through the insulation layers 16b and 16c in the up-down direction, and connects the upstream end of the inductor conductor layer 18a to the downstream end of the inductor conductor layer 18b. The via hole conductor v2 passes through the insulation layer 16d in the up-down direction, and connects the upstream end of the inductor conductor layer 18b to the downstream end of the inductor conductor layer 18c. The via hole conductor v3 passes through the insulation layer 16e in the up-down direction, and connects the upstream end of the inductor conductor layer 18c to the downstream end of the inductor conductor layer 18d.

The inductor conductor layers 18a to 18d and the via hole conductors v1 to v3 described thus far define the inductor L1. When viewed in plan view from above, the inductor L1 preferably has a spiral shape progressing upward while circling in the clockwise direction.

The inductor conductor layers 20a to 20c are linear conductor layers provided in right-half regions of the front surfaces of the insulation layers 16j to 16l. The inductor conductor layers 20a to 20c each has a shape obtained by cutting out a portion of a rectangular or substantially rectangular ring shape. When viewed in plan view from above, the inductor conductor layers 20a to 20c overlap with each other to define a rectangular or substantially rectangular ring-shaped track. Hereinafter, an end portion of the inductor conductor layers 20a to 20c on an upstream side in the counter-clockwise direction will be called an upstream end, and an end portion of the inductor conductor layers 20a to 20c on a downstream side in the counter-clockwise direction will be called a downstream end. The upstream end of the inductor conductor layer 20a is extended to the vicinity of a right end on the front side of the insulation layer 16j, and is connected to the side surface portion 115b (an example of a portion of the second input/output terminal provided on a side surface of the multilayer body).

The via hole conductor v4 passes through the insulation layer 16j in the up-down direction, and connects the downstream end of the inductor conductor layer 20a to the upstream end of the inductor conductor layer 20b. The via hole conductor v5 passes through the insulation layer 16k in the up-down direction, and connects the downstream end of the inductor conductor layer 20b to the upstream end of the inductor conductor layer 20c.

The inductor conductor layers 20a to 20c and the via hole conductors v4 and v5 described thus far define the inductor L2. When viewed in plan view from above, the inductor L2 has a spiral shape progressing downward while circling in the counter-clockwise direction.

The capacitor conductor layer 22 is provided on the front surface of the insulation layer 16n, and preferably has an L shape. Specifically, the capacitor conductor layer 22 extends toward the front side and then bends toward the left side. The capacitor conductor layer 26 is provided near the left-front corner on the front surface of the insulation layer 16m, and preferably is rectangular or substantially rectangular in shape. The capacitor conductor layer 26 is extended to the vicinity of the left end of the front side of the insulation layer 16m, and is connected to the side surface portion 115d. The capacitor conductor layer 22 and the capacitor conductor layer 26 overlap when viewed in plan view from above, and define the capacitor C1.

The via hole conductor v6 passes through the insulation layers 16l and 16m in the up-down direction, and connects the downstream end of the inductor conductor layer 20c to the capacitor conductor layer 22. The inductor L2 and the capacitor C1 are connected in series as a result.

The capacitor conductor layer 28 is provided near the center on the front surface of the insulation layer 16g. The capacitor conductor layer 28 is extended to the vicinity of the right end of the rear side of the insulation layer 16g, and is connected to the side surface portion 115a. The capacitor conductor layer 32 is provided near the left-rear corner on the front surface of the insulation layer 16i. The capacitor conductor layer 32 is extended to the vicinity of the left end of the rear side of the insulation layer 16i, and is connected to the side surface portion 115c. The capacitor conductor layer 30 is provided in a left-half region of the front surface of the insulation layer 16h, and preferably is rectangular or substantially rectangular in shape. The capacitor conductor layer 28 and the capacitor conductor layer 30 overlap when viewed in plan view from above, and define the capacitor C2. The capacitor conductor layer 30 and the capacitor conductor layer 32 also overlap when viewed in plan view from above, and the capacitor conductor layers 30 and 32 define the capacitor C4.

The capacitor conductor layer 34 is provided in a left-half region of the front surface of the insulation layer 16g, and preferably is rectangular or substantially rectangular in shape. The capacitor conductor layer 30 and the capacitor conductor layer 34 overlap when viewed in plan view from above, and define the capacitor C3.

The inductor conductor layers 36a to 36c are linear conductor layers provided in left-half regions of the front surfaces of the insulation layers 16b to 16d. The inductor conductor layers 36a to 36c each has a shape obtained by cutting out a portion of a rectangular or substantially rectangular ring shape. When viewed in plan view from above, the inductor conductor layers 36a to 36c overlap with each other to define a rectangular or substantially rectangular ring-shaped track. Hereinafter, an end portion of the inductor conductor layers 36a to 36c on an upstream side in the counter-clockwise direction will be called an upstream end, and an end portion of the inductor conductor layers 36a to 36c on a downstream side in the counter-clockwise direction will be called a downstream end. The downstream end of the inductor conductor layer 36a is extended to the vicinity of a left end on the front side of the insulation layer 16b, and is connected to the side surface portion 115d.

The via hole conductor v7 passes through the insulation layer 16b in the up-down direction, and connects the upstream end of the inductor conductor layer 36a to the downstream end of the inductor conductor layer 36b. The via hole conductor v8 passes through the insulation layer 16c in the up-down direction, and connects the upstream end of the inductor conductor layer 36b to the downstream end of the inductor conductor layer 36c.

The inductor conductor layers 36a to 36c and the via hole conductors v7 and v8 described thus far define the inductor L3. When viewed in plan view from above, the inductor L3 preferably has a spiral shape progressing upward while circling in the counter-clockwise direction.

The via hole conductor v9 passes through the insulation layers 16d to 16f in the up-down direction, and connects the upstream end of the inductor conductor layer 36c to the capacitor conductor layer 34. The inductor L3 and the capacitor C3 are connected in series as a result.

The capacitor conductor layer 24 is a conductor layer provided on the front surface of the insulation layer 16o, and defines and functions as a ground conductor layer kept at a ground potential. In other words, the capacitor conductor layer 24 is provided between the low pass filter (the inductor L1 and the LC serial resonator LC1) and the bottom surface portions 114a and 114b with respect to the up-down direction. No other conductor layers are present between the capacitor conductor layer 24 and the bottom surface portions 114a and 114b. The capacitor conductor layer 24 includes a capacitance portion 24a and an inductor portion 24b.

The capacitance portion 24a is a rectangular or substantially rectangular conductor layer provided in a right-half region of the front surface of the insulation layer 16o, and when viewed in plan view from above, overlaps with the bottom surface portions 114a and 114b. As a result, the capacitance portion 24a and the bottom surface portion 114a define the capacitor C5. Meanwhile, the capacitance portion 24a and the bottom surface portion 114b define the capacitor C6.

Furthermore, when viewed in plan view from above, the capacitance portion 24a overlaps with the inductor L2 (an example of a second inductor). As a result, the capacitance portion 24a is located between the inductor L2 and the bottom surface portions 114a and 114b. This reduces or prevents a situation in which the inductor L2 and the bottom surface portions 114a and 114b oppose each other directly with the insulation layers 16l to 16o located therebetween.

The inductor portion 24b is a band-shaped conductor layer provided in a left-half region of the front surface of the insulation layer 16o, and is connected to the capacitance portion 24a and the side surface portion 115d. A line width of the inductor portion 24b is lower than a minimum value of the width of the capacitance portion 24a in a direction (a left-right direction; an example of a second direction) perpendicular or substantially perpendicular to the direction in which the bottom surface portions 114a and 114b are arranged (the front-rear direction; and example of a first direction) and the up-down direction. In other words, the line width of the inductor portion 24b is smaller than the length of a shorter side of the capacitance portion 24a. As a result, the inductor portion 24b defines the inductor L4.

However, the capacitor conductor layer 24 does not overlap with the bottom surface portion 114c when viewed in plan view from above.

According to the electronic component 10 of the present preferred embodiment, isolation between the outer electrode 14a and the outer electrode 14b is improved. To be more specific, the capacitance portion 24a is provided between the low pass filter (the inductor L1 and the LC serial resonator LC1) and the bottom surface portions 114a and 114b in the up-down direction, and overlaps with the bottom surface portions 114a and 114b when viewed in plan view from above. Furthermore, the capacitance portion 24a is kept at ground potential. As such, a high-frequency signal inputted from the bottom surface portion 114a is absorbed by the capacitance portion 24a even if that high-frequency signal is radiated toward the low pass filter. Likewise, the high-frequency signal propagating through the low pass filter is absorbed by the capacitance portion 24a even if that high-frequency signal is radiated toward the bottom surface portion 114b. A situation in which the high-frequency signal inputted from the bottom surface portion 114a is outputted from the bottom surface portion 114b without passing through the low pass filter is significantly reduced or prevented as a result. Thus, according to the electronic component 10, isolation between the outer electrode 14a and the outer electrode 14b is improved.

Furthermore, according to the electronic component 10, a situation in which an unnecessary high-frequency signal is inputted to the outer electrodes 14a and 14b is significantly reduced or prevented. To be more specific, the inductor L2 fulfils a role of conducting unnecessary high-frequency signals at frequencies higher than the cutoff frequency of the low pass filter to the ground. Thus, if the inductor L2 and the bottom surface portions 114a and 114b oppose each other directly with the insulation layers 16l to 16o located therebetween, a magnetic flux produced by the inductor L2 will pass through the bottom surface portions 114a and 114b, and thus noise will enter into the bottom surface portions 114a and 114b.

Accordingly, the capacitance portion 24a overlaps with the inductor L2 when viewed in plan view from above. This prevents a situation in which the inductor L2 and the bottom surface portions 114a and 114b oppose each other directly with the insulation layers 16l to 16n located therebetween. As a result, a situation in which a magnetic flux produced by the inductor L2 passes through the bottom surface portions 114a and 114b is significantly reduced or prevented, and thus a situation in which an unnecessary high-frequency signal is inputted into the outer electrodes 14a and 14b is significantly reduced or prevented as well.

Furthermore, according to the electronic component 10, the performance of the low pass filter is improved. To be more specific, the capacitor conductor layer 24 includes the capacitance portion 24a and the inductor portion 24b. The LC serial resonators LC3 and LC4 are provided as a result. The LC serial resonator LC4 fulfils a role of shifting an attenuation pole located at a higher frequency than the cutoff frequency of the low pass filter in the bandpass characteristics to the vicinity of that cutoff frequency. As a result, the attenuation becomes higher near the cutoff frequency in the bandpass characteristics. This improves the performance of the low pass filter. "Bandpass characteristics" refers to a value of a ratio of the strength of the high-frequency signal inputted from the outer electrode 14a to the strength of the high-frequency signal outputted from the outer electrode 14b.

The inventors of preferred embodiments of the present invention carried out a first computer simulation and a second computer simulation, described next, to further clarify the effects provided by the electronic component 10.

The first computer simulation will be described first. The inventors of preferred embodiments of the present invention created a first model having the configuration illustrated in FIG. 3, and then created a second model in which the capacitance portion 24a and the inductor portion 24b were removed from the configuration illustrated in FIG. 3. The inventors of preferred embodiments of the present invention then examined first bandpass characteristics and second bandpass characteristics of the first model and the second model. "First bandpass characteristics" refers to a value of a ratio of the strength of the high-frequency signal inputted from the outer electrode 14a to the strength of the high-frequency signal outputted from the outer electrode 14b. "Second bandpass characteristics" refers to a value of a ratio of the strength of the high-frequency signal inputted from the outer electrode 14a to the strength of the high-frequency signal outputted from the outer electrode 14c.

Figure 4:
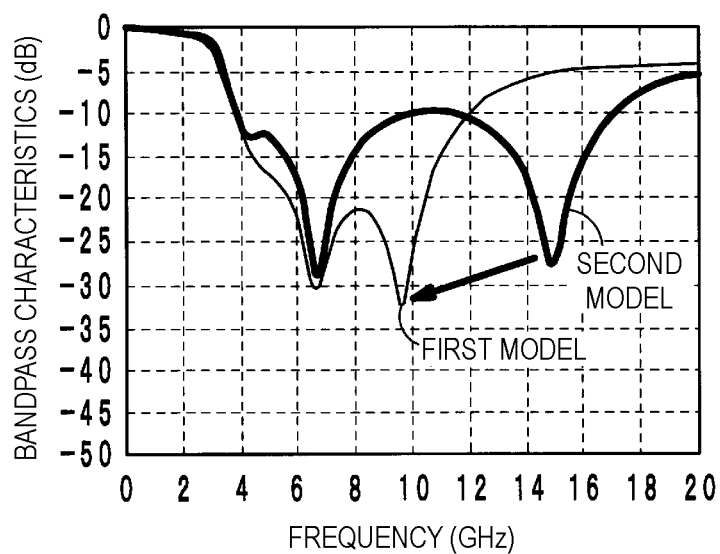
FIG. 4 is a graph illustrating first bandpass characteristics.
Figure 5:
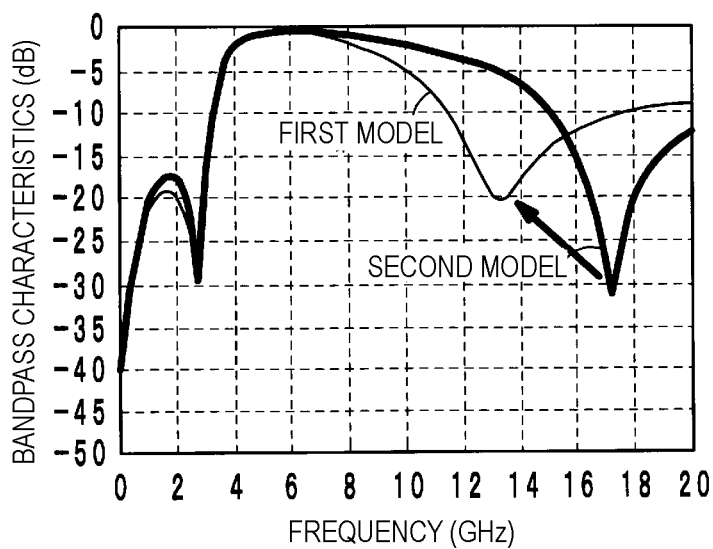
FIG. 5 is a graph illustrating second bandpass characteristics.

FIG. 4 is a graph illustrating the first bandpass characteristics. FIG. 5 is a graph illustrating the second bandpass characteristics. The vertical axis represents the bandpass characteristics, and the horizontal axis represents frequency.

From FIG. 4, it can be seen that the frequency of the attenuation pole in the first model is lower than the frequency of the attenuation pole in the second model. This is because the LC serial resonator LC4 has been added. As a result, the attenuation is greater in frequencies higher than the cutoff frequency of the low pass filter. Thus, according to the first model (the electronic component 10), the performance of the low pass filter is improved.

Meanwhile, from FIG. 5, it can be seen that the frequency of the attenuation pole in the first model is lower than the frequency of the attenuation pole in the second model. This is because the LC serial resonator LC3 has been added.

The second computer simulation will be described next. The inventors of preferred embodiments of the present invention created a third model and a fourth model having the configuration illustrated in FIG. 3. The line width of the inductor portion 24b was about 75 μm in the third model, and the line width of the inductor portion 24b was about 125 μm in the fourth model, for example. The inventors of preferred embodiments of the present invention then examined the first bandpass characteristics and the second bandpass characteristics of the third model and the fourth model.

Figure 6:
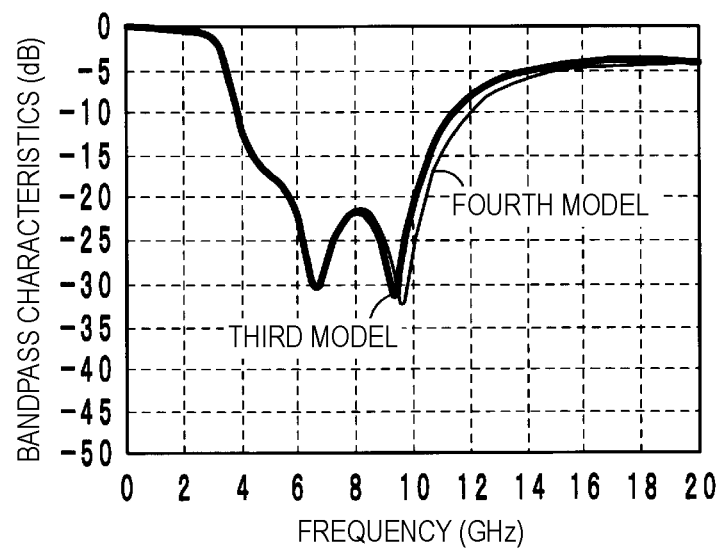
FIG. 6 is a graph illustrating first bandpass characteristics.
Figure 7:
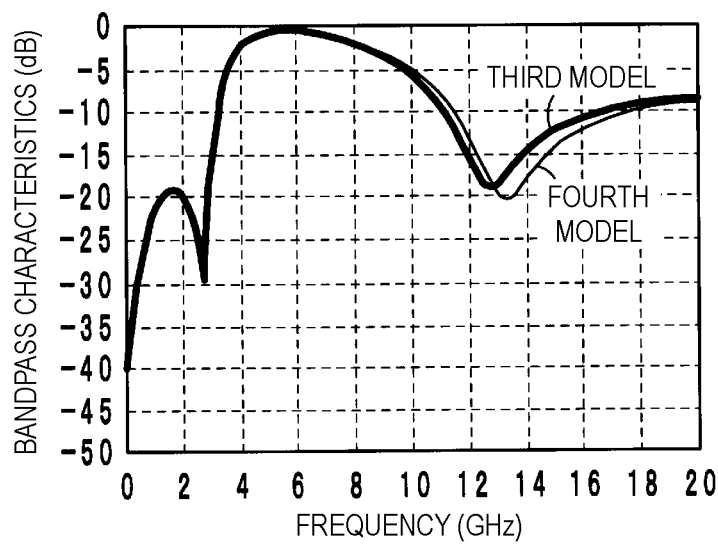
FIG. 7 is a graph illustrating second bandpass characteristics.

FIG. 6 is a graph illustrating the first bandpass characteristics. FIG. 7 is a graph illustrating the second bandpass characteristics.

From FIG. 6 and FIG. 7, it can be seen that the frequency of the attenuation pole in the third model is lower than the frequency of the attenuation pole in the fourth model. This is due to the following reasons. If the line width of the inductor portion 24b is reduced, the inductance value of the inductor L4 increases, and the resonant frequencies of the LC serial resonators LC3 and LC4 decrease. The frequency of the attenuation pole decreases as a result. Thus, in the electronic component 10, a narrower line width is preferable for the inductor portion 24b, from the standpoint of improving the performance of the low pass filter.

Figure 8:
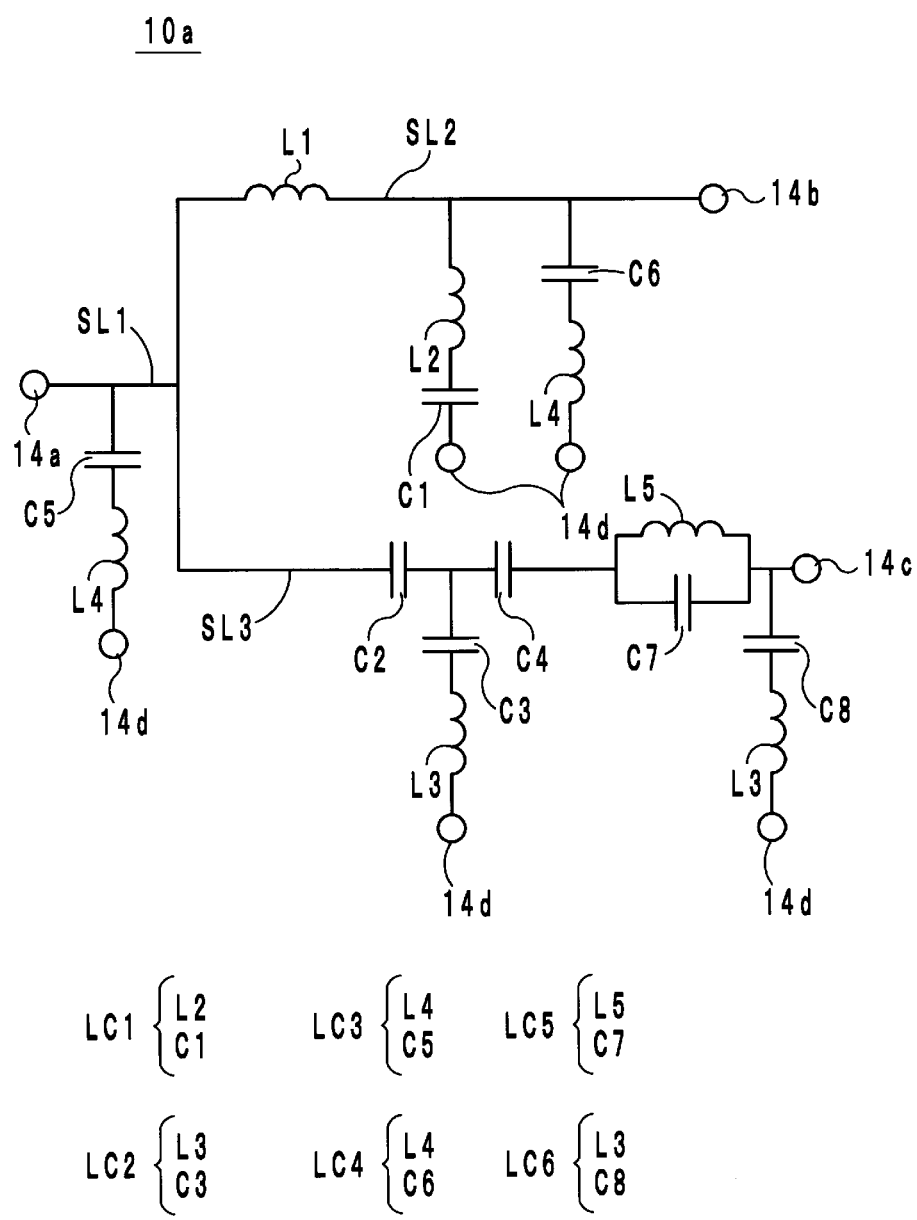
Figure 9:
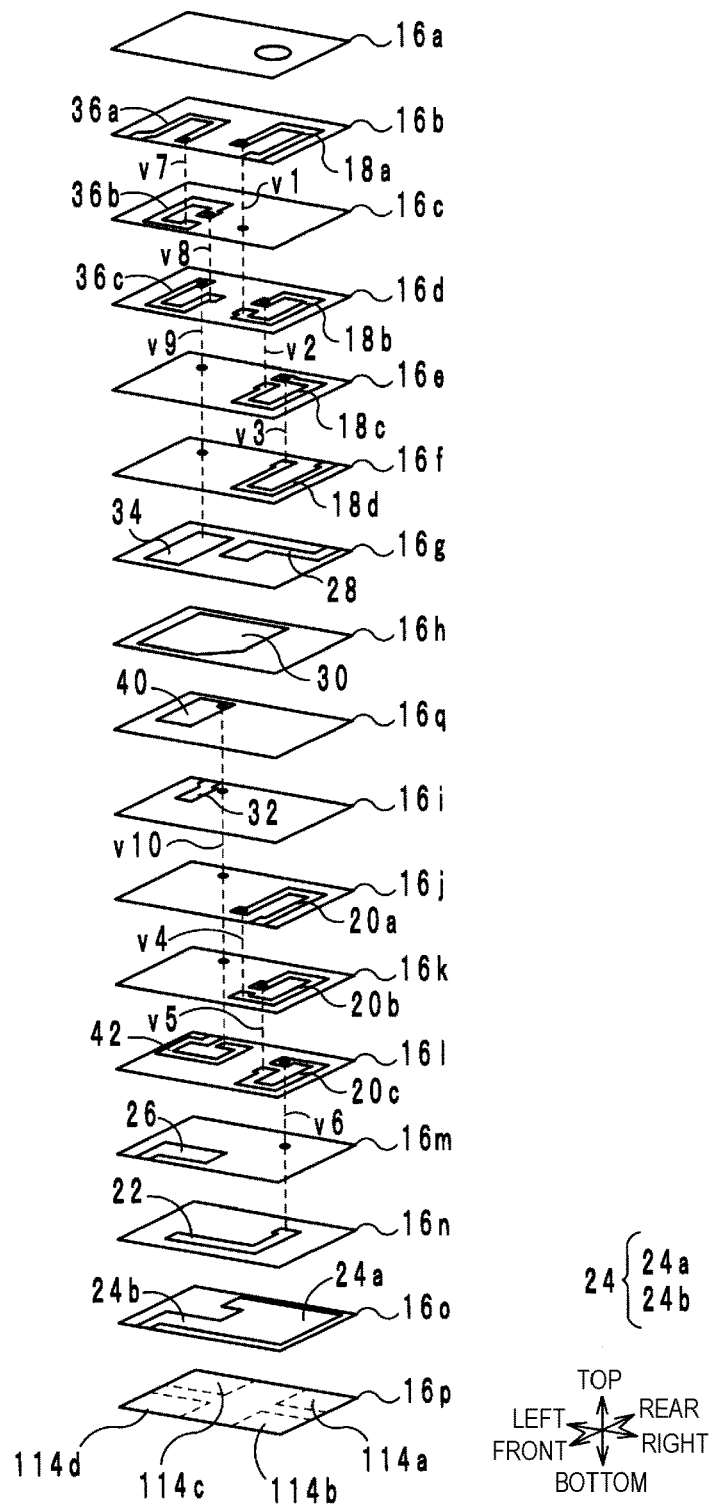
Figure 10:
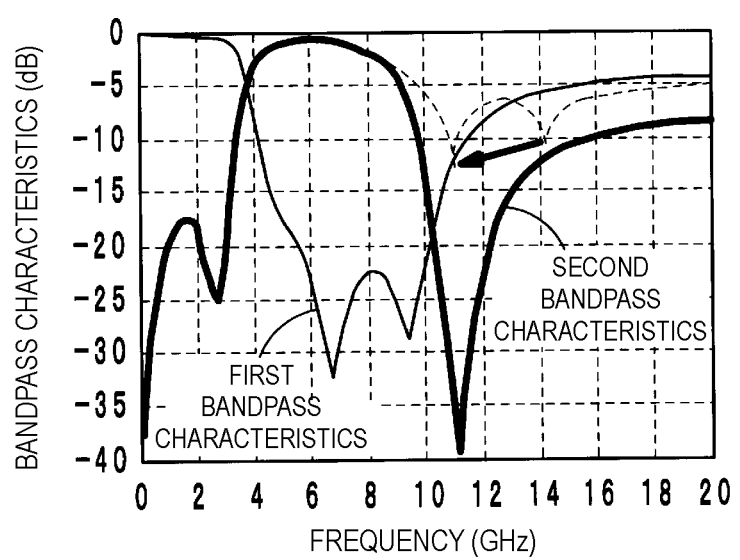

Next, an electronic component 10a according to a variation of a preferred embodiment of the present invention will be described with reference to the drawings. FIG. 8 is an equivalent circuit diagram of the electronic component 10a. FIG. 9 is an exploded perspective view of the electronic component 10a. FIG. 10 is a graph illustrating bandpass characteristics of the electronic component 10a. FIG. 2 will be referred to for an external perspective view.

The electronic component 10a differs from the electronic component 10 in terms of the following two points. The first difference is that the electronic component 10a includes an LC parallel resonator LC5. The second difference is that the electronic component 10a includes an LC serial resonator LC6.

First, the first difference will be described. As illustrated in FIG. 8, the LC parallel resonator LC5 is connected between the capacitor C4 and the outer electrode 14c. The LC parallel resonator LC5 is defined by connecting an inductor L5 and a capacitor C7 in parallel.

Additionally, in the electronic component 10a, an insulation layer 16q is provided between the insulation layer 16h and the insulation layer 16i. Furthermore, the electronic component 10a further includes a capacitor conductor layer 40, an inductor conductor layer 42, and a via hole conductor v10.

The capacitor conductor layer 40 is a rectangular or substantially rectangular conductor layer provided in a left-half region of the front surface of the insulation layer 16q. The capacitor conductor layer 30 and the capacitor conductor layer 40 overlap when viewed in plan view from above. The capacitor conductor layers 30 and 40 define the capacitor C4. Additionally, the capacitor conductor layer 32 and the capacitor conductor layer 40 overlap when viewed in plan view from above. The capacitor conductor layers 32 and 40 define the capacitor C7.

The inductor conductor layer 42 is a linear conductor layer provided in a left-half region of the front surface of the insulation layer 16l. The inductor conductor layer 42 has a shape obtained by cutting out a portion of a rectangular or substantially rectangular ring shape. Hereinafter, an end portion of the inductor conductor layer 42 on an upstream side in the clockwise direction will be called an upstream end, and an end portion of the inductor conductor layer 42 on a downstream side in the clockwise direction will be called a downstream end. The downstream end of the inductor conductor layer 42 is extended to the vicinity of a left end on the rear side of the insulation layer 16l, and is connected to the side surface portion 115c.

The via hole conductor v10 passes through the insulation layers 16q and 16i to 16k in the up-down direction, and connects the capacitor conductor layer 40 to the upstream end of the inductor conductor layer 42.

Next, the second difference will be described. The LC serial resonator LC6 is connected between the outer electrode 14c and LC parallel resonator LC5, and the outer electrode 14d. In the LC serial resonator LC6, the inductor L3 and a capacitor C8 are connected in series.

As illustrated in FIG. 9, the capacitance portion 24a overlaps with the bottom surface portion 114c when viewed in plan view from above. The capacitor C8 is provided as a result. Accordingly, the LC serial resonator LC6 is connected between the outer electrode 14c and LC parallel resonator LC5, and the outer electrode 14d. However, an area throughout which the bottom surface portion 114c and the capacitance portion 24a overlap is smaller than an area throughout which the bottom surface portion 114a and the capacitance portion 24a overlap and an area throughout which the bottom surface portion 114b and the capacitance portion 24a overlap.

According to the electronic component 10a configured as described above, the same actions and effects as the electronic component 10 are achieved.

Furthermore, according to the electronic component 10a, a decrease in the second bandpass characteristics on a high-frequency side of the pass band is able to be made steep, as illustrated in FIG. 10. To be more specific, in the electronic component 10a, the LC parallel resonator LC5 and the LC serial resonator LC6 are added. Thus, as indicated by the dotted line in FIG. 10, the LC parallel resonator LC5 and the LC serial resonator LC6 define an attenuation pole near 11 GHz. Accordingly, in the case where the capacitance portion 24a does not overlap with the bottom surface portion 114c, attenuation poles are provided near 14 GHz and near 11 GHz, as indicated by the dotted line in FIG. 10.

However, in the electronic component 10a, the capacitance portion 24a overlaps with the bottom surface portion 114c. Accordingly, the attenuation pole near 14 GHz becomes closer to the attenuation pole near 11 GHz. The two attenuation poles overlap as a result, thus producing an increase in the attenuation at the attenuation pole near 11 GHz. As a result, according to the electronic component 10a, a decrease in the second bandpass characteristics on a high-frequency side of the pass band is able to be made steep.

Other Preferred Embodiments

The electronic components according to preferred embodiments of the present invention are not limited to the above-described electronic components 10 and 10a, and can be modified without departing from the essential spirit thereof.

Note that the electronic component 10 need not include a high pass filter.

Additionally, the configurations of the electronic components 10 and 10a may be combined as desired.

As described above, preferred embodiments of the present invention are useful in electronic components, and are particularly advantageous in that isolation between input/output terminals is improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a multilayer body including a plurality of insulation layers stacked in a stacking direction, and a mounting surface that opposes a circuit board when the electronic component is mounted on the circuit board;
a first input/output terminal and a second input/output terminal that are provided on the mounting surface and are adjacent to each other;
a ground terminal;
a first filter circuit provided in the multilayer body and electrically connected between the first input/output terminal and the second input/output terminal; and
a ground conductor layer, provided between the first filter circuit and the mounting surface in the stacking direction, that overlaps with the first input/output terminal and the second input/output terminal when viewed in a plan view from the stacking direction, and that is connected to the ground terminal.

2. The electronic component according to claim 1, wherein the ground conductor layer includes:
a capacitance portion that overlaps with the first input/output terminal and the second input/output terminal when viewed in the plan view from the stacking direction; and
an inductor portion that is connected to the capacitance portion and the ground terminal.

3. The electronic component according to claim 2, wherein the inductor portion has a band shape.

4. The electronic component according to claim 2, wherein
the first input/output terminal and the capacitance portion define a first capacitor;
the second input/output terminal and the capacitance portion define a second capacitor;
the inductor portion defines a first inductor;
the first capacitor and the first inductor define a first LC serial resonator; and
the second capacitor and the first inductor define a second LC serial resonator.

5. The electronic component according to claim 2, wherein a line width of the inductor portion is smaller than a minimum value of a width of the capacitance portion in a second direction perpendicular or substantially perpendicular to both a first direction in which the first input/output terminal and the second input/output terminal are arranged and the stacking direction.

6. The electronic component according to claim 1, wherein the first filter circuit is a low pass filter.

7. The electronic component according to claim 6, wherein
the first filter circuit includes a second inductor; and
the ground conductor layer overlaps with the second inductor when viewed in the plan view from the stacking direction.

8. The electronic component according to claim 1, further comprising:
a third input/output terminal provided on the mounting surface; and
a high pass filter provided in the multilayer body and that is connected between the first input/output terminal and the third input/output terminal; wherein
the ground conductor layer overlaps with the third input/output terminal when viewed in the plan view from the stacking direction.

9. The electronic component according to claim 1, wherein
the first input/output terminal and the second input/output terminal are provided on a side surface of the multilayer body parallel or substantially parallel to the stacking direction; and
the first filter circuit is connected to portions of the first input/output terminal and the second input/output terminal provided on the side surface of the multilayer body.

10. The electronic component according to claim 1, wherein the electronic component is a diplexer.

11. The electronic component according to claim 1, wherein the multilayer body includes signal paths, inductors, and capacitors.

12. The electronic component according to claim 1, wherein the first filter circuit includes LC serial resonators that define a low pass filter.

13. The electronic component according to claim 1, wherein the multilayer body includes capacitors and an LC serial resonator that define a high pass filter.

14. The electronic component according to claim 1, wherein the multilayer body includes inductor conductor layers, capacitor conductor layers and via hole conductors.

15. The electronic component according to claim 14, wherein the inductor conductor layers and the via conductors define an inductor.

16. The electronic component according to claim 1, wherein the multilayer body includes an LC parallel resonator.

17. The electronic component according to claim 1, wherein the multilayer body includes an LC serial resonator.

* * * * *